(12) United States Patent
Kamitani et al.

(10) Patent No.: US 8,287,253 B2
(45) Date of Patent: Oct. 16, 2012

(54) FLUID CONVEYANCE DEVICE

(75) Inventors: Gaku Kamitani, Kyoto-fu (JP);
Atsuhiko Hirata, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 36 days.

(21) Appl. No.: 13/105,927

(22) Filed: May 12, 2011

(65) Prior Publication Data

US 2011/0229356 A1 Sep. 22, 2011

Related U.S. Application Data

(60) Division of application No. 12/476,395, filed on Jun. 2, 2009, which is a continuation of application No. PCT/JP2008/053384, filed on Feb. 27, 2008.

(30) Foreign Application Priority Data

Mar. 12, 2007 (JP) ................................. 2007-061703

(51) Int. Cl.
*F04B 17/00* (2006.01)
*H01L 41/047* (2006.01)

(52) U.S. Cl. ..................... 417/413.2; 977/733; 310/328; 310/366; 310/369

(58) Field of Classification Search ............... 417/410.2, 417/413.1, 413.2; 310/328, 365, 366, 369; 977/723, 724
See application file for complete search history.

(56) References Cited

U.S. PATENT DOCUMENTS

| 6,960,864 B2 * | 11/2005 | Urano et al. ........... 310/307 |
| 2007/0029070 A1 * | 2/2007 | Yamamoto et al. ...... 165/104.28 |
| 2009/0232685 A1 * | 9/2009 | Kamitani et al. ....... 417/413.2 |

OTHER PUBLICATIONS

Kamitani et al.; "Fluid Conveyance Device"; U.S. Appl. No. 12/476,395, filed Jun. 2, 2009.

* cited by examiner

*Primary Examiner* — Devon Kramer
*Assistant Examiner* — Bryan Lettman
(74) *Attorney, Agent, or Firm* — Keating & Bennett, LLP

(57) ABSTRACT

A fluid conveyance device includes a substrate, and a disk-shaped piezoelectric element arranged in a bendable manner on the substrate. A plurality of substantially circular concentric segment electrodes are provided on the piezoelectric element, and are provided with voltages with phases that are shifted. A wavy ring deformation is thus produced on the piezoelectric element. A pocket produced between the piezoelectric element and the substrate is moved in a radial direction so as to convey a fluid from an outer substantially circular portion to a central portion and to discharge the fluid from the central portion.

3 Claims, 18 Drawing Sheets

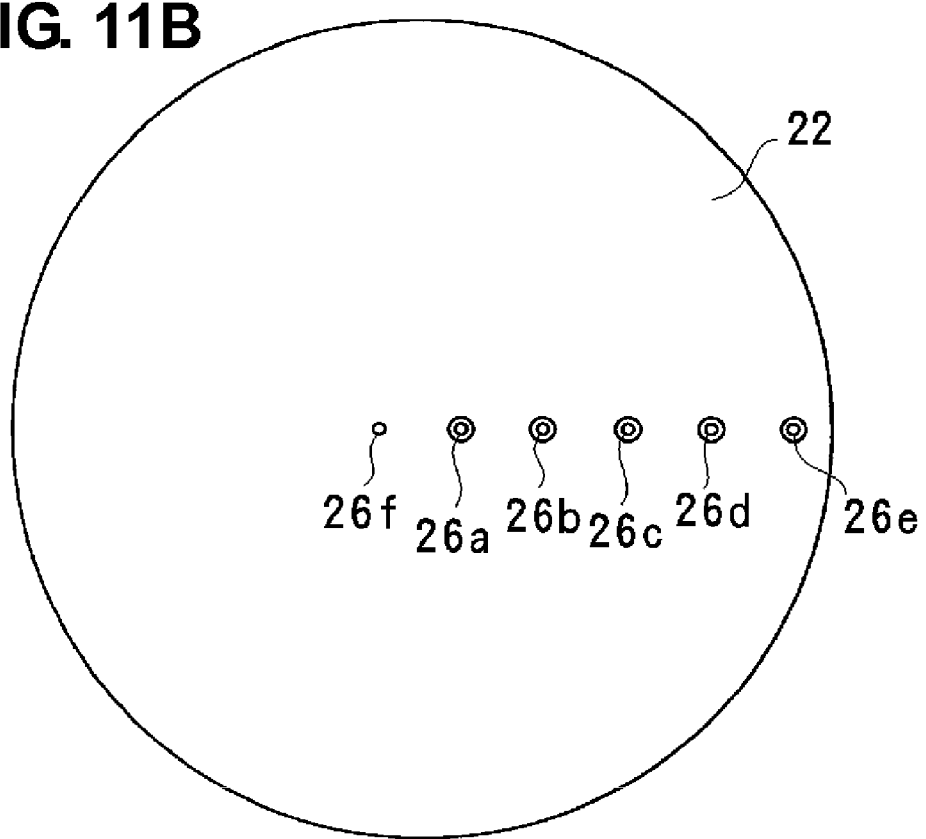

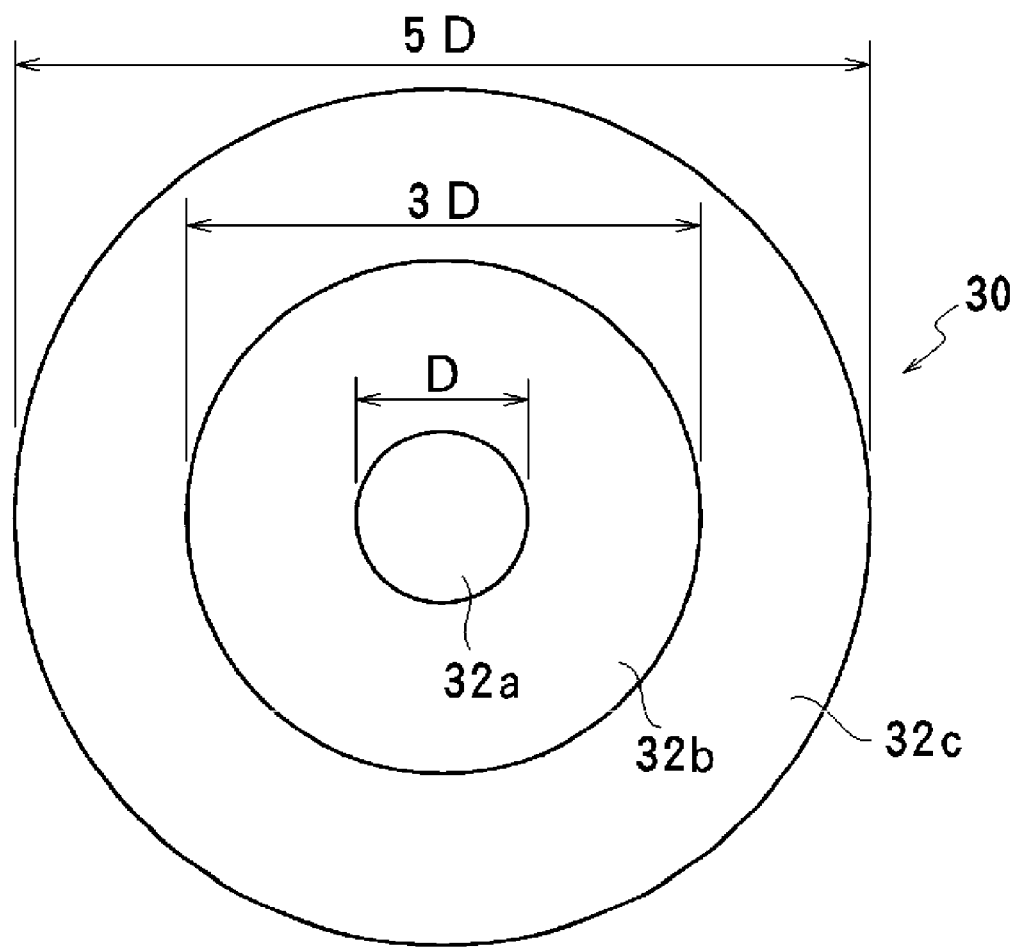

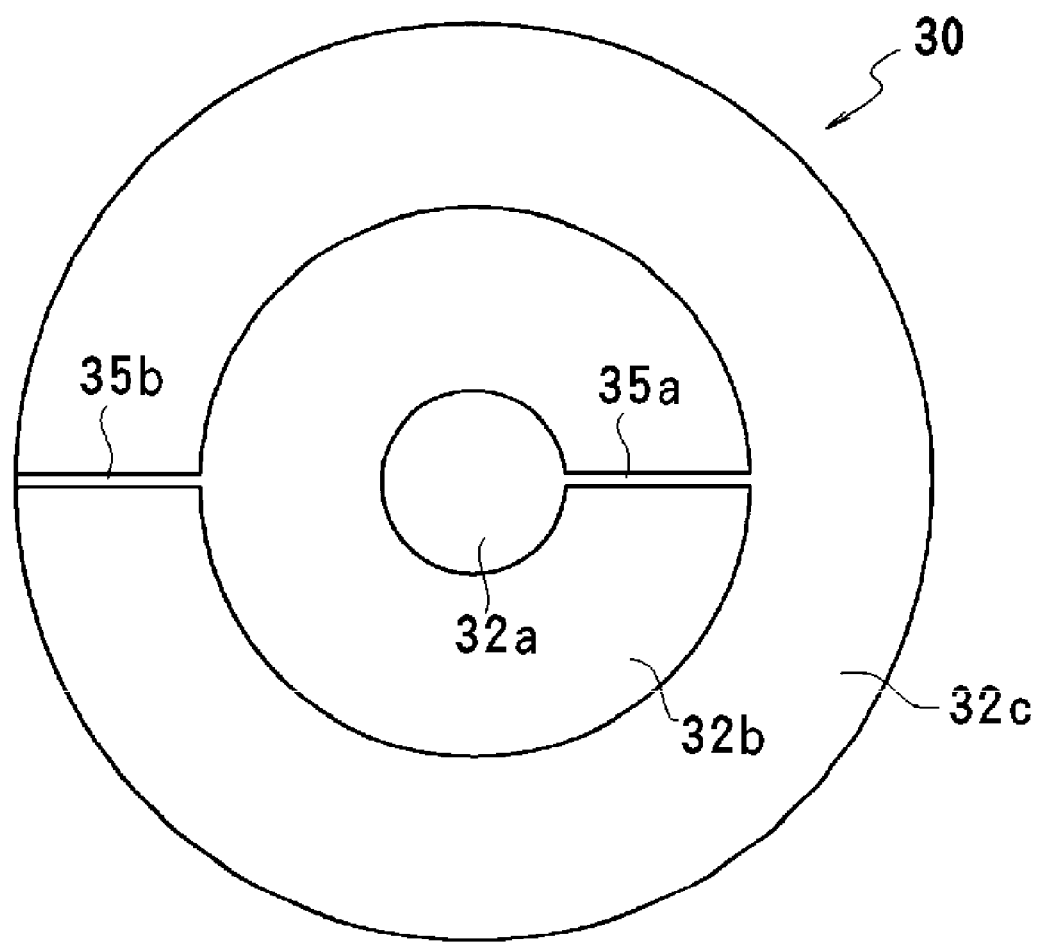

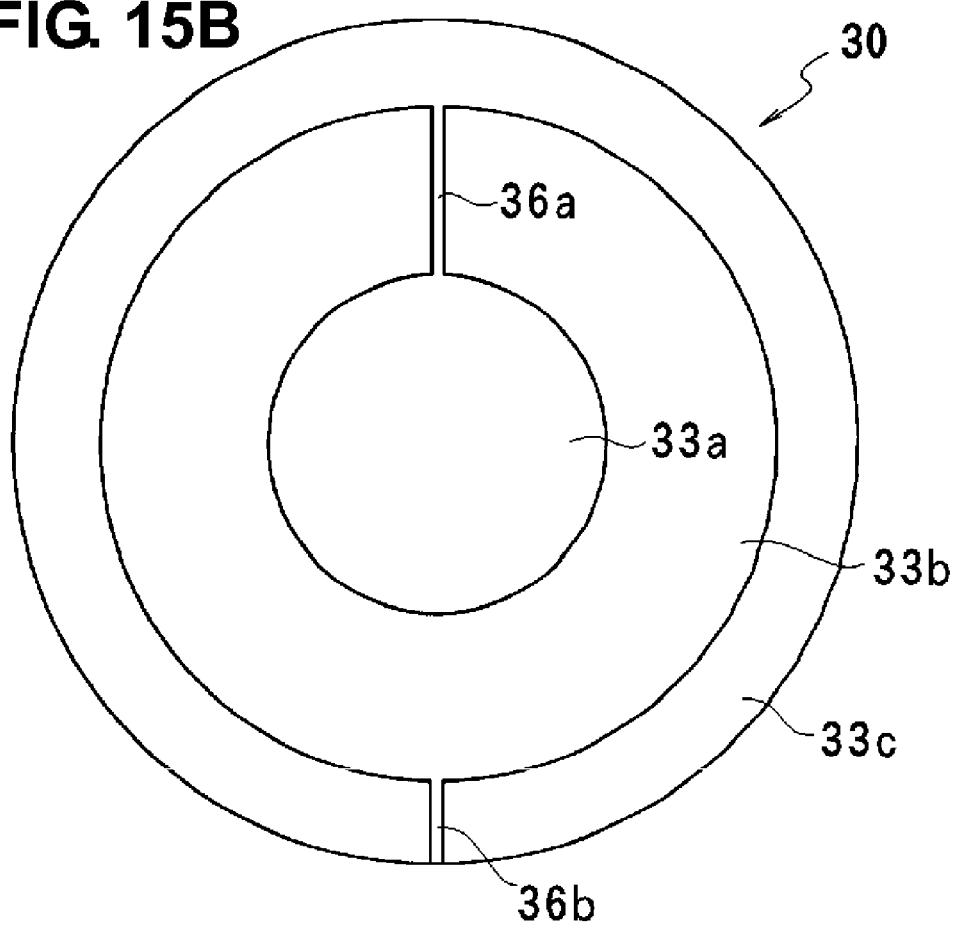

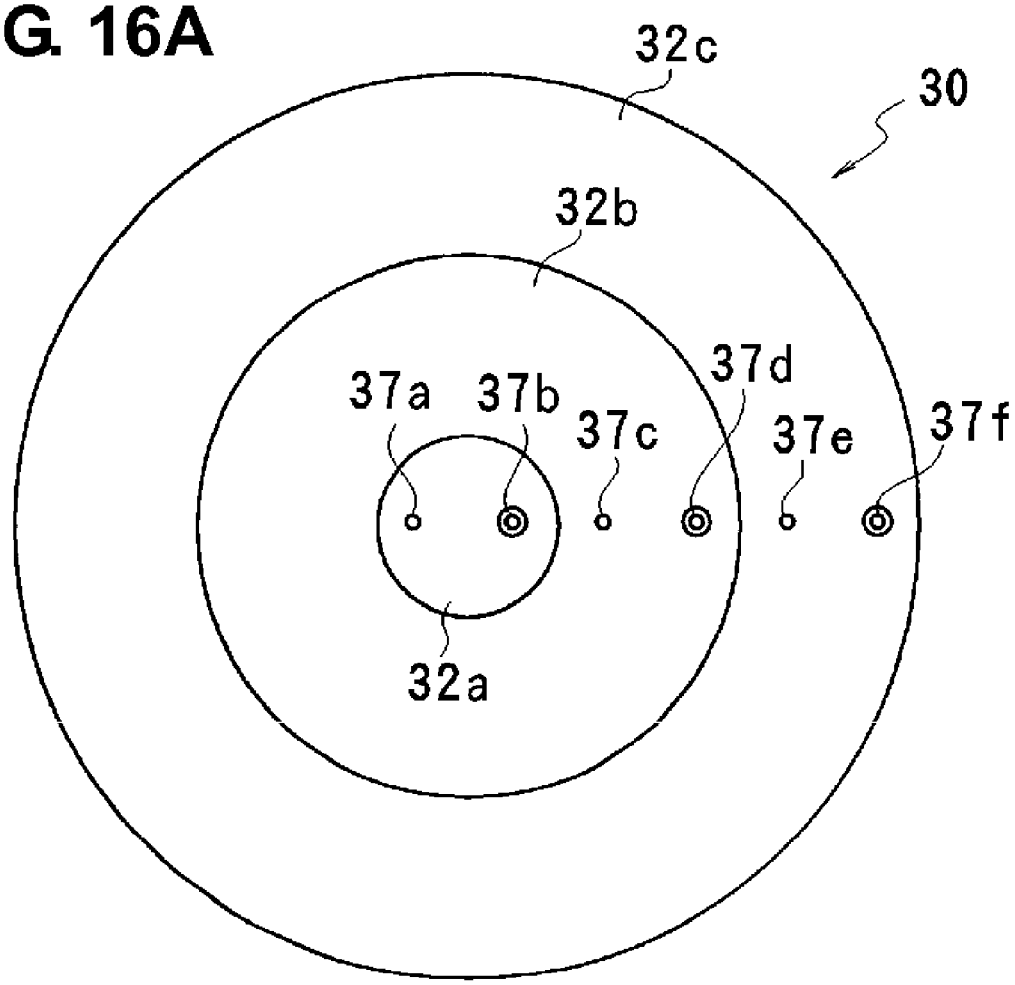

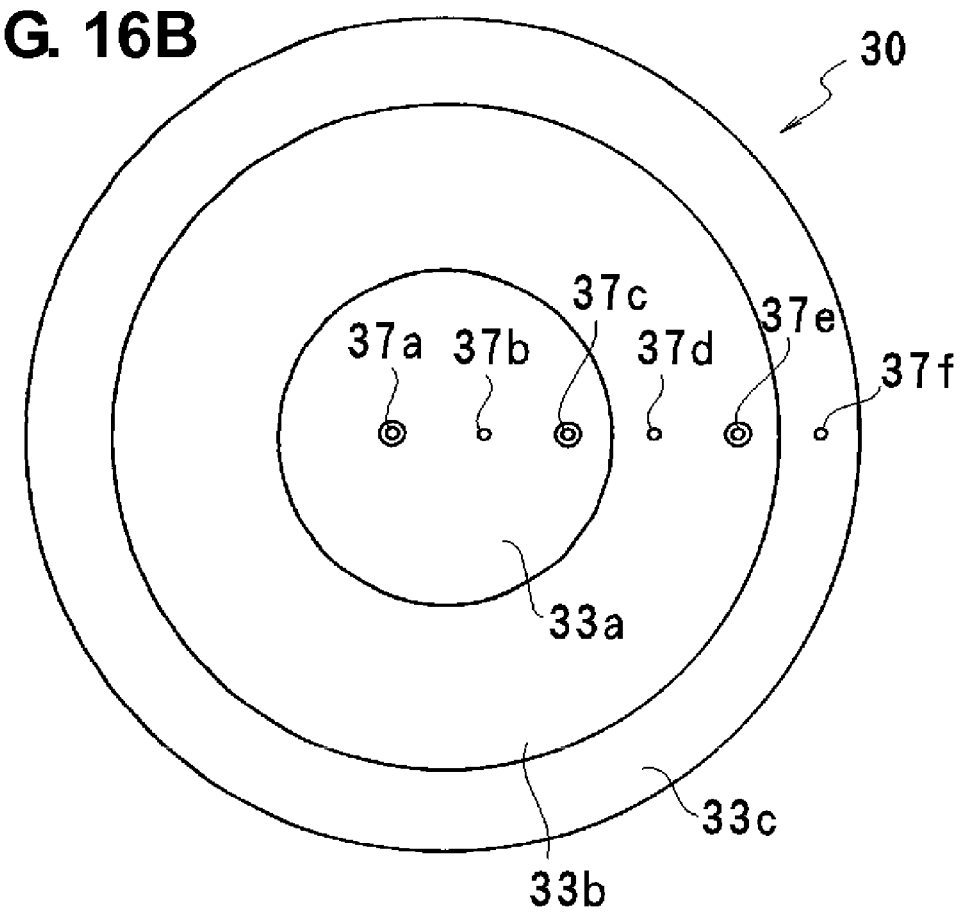

( C = 17, R = 15, k = 0.8 )

FLUID CONVEYANCE DEVICE

BACKGROUND OF THE INVENTION

1. Field of the Invention

The present invention relates to fluid conveyance devices and, in particular, to a fluid conveyance device utilizing a bending piezoelectric element.

2. Description of the Related Art

A piezoelectric pump has been used as a coolant water pump for a compact electronic apparatus, such as a notebook personal computer, and a fuel transport pump for a fuel cell, for example. The piezoelectric pump is also used as a fan pump which replaces a cooling fan for a CPU or other electronic apparatus, or a fan pump for supplying oxygen required by a fuel cell that generates power. The piezoelectric pump is a pump that utilizes a piezoelectric element that bends into a shape thereof in response to voltage application. The advantages of the piezoelectric pump are a simple and thin structure and low power consumption.

Japanese Unexamined Patent Application Publication No. 2-149778 and Japanese Unexamined Patent Application Publication No. 4-86388 disclose piezoelectric pumps. In the piezoelectric pumps, a vibration plate is arranged in contact with a pump body having an inlet port and an outlet port, and a plurality of piezoelectric elements are arranged from the inlet port to the outlet port on the vibration plate. In this pump, when the piezoelectric elements arranged from the inlet portion to the outlet port are successively driven, the vibration plate is bent, one portion after another, from the inlet port to the outlet port so that a fluid is pushed from the inlet port to the outlet port. When voltage applied to the piezoelectric element stops, a flow passage between the inlet port and the outlet port is closed in response to a recovery of the vibration plate. Therefore, a check valve between the inlet port and the outlet port is not required.

In the above-described related art, the piezoelectric pump includes the plurality of bonded piezoelectric elements which have voltages that are different in phases applied thereto, and thus, operates as a tube pump which conveys a fluid from one end to the other end of the pump body. Since the plurality of piezoelectric elements are arranged in a plane, the pump has a bulky and complex structure. Since the plurality of piezoelectric elements operate in a tube-pump mode, the structure of an elastically deformable joint connecting the piezoelectric elements and sealing of the fluid presents difficulties. A mechanism for conveying a miniature volume pocket holding the fluid is also difficult to implement.

Japanese Unexamined Patent Application Publication No. 1-500892 discloses a fluid pump which includes ring segment electrodes provided on each of a central portion and a periphery portion of a piezoelectric element. The central portion and the periphery portion are expanded and contracted in opposite directions to bend the piezoelectric element and thus functions as a pump to convey a fluid. The piezoelectric element is rectangular, and segment electrodes are arranged in a longitudinal direction of the piezoelectric element. In this case, the bending shape of the piezoelectric element is also in a tube-pump mode in which the piezoelectric element bends from one end to the other end. As in the above-described related art, a plurality of electrodes must be arranged in the direction of motion, and the pump has a bulky structure. Sealing of a joint connecting the elastically deformable electrodes is also difficult.

A miniature volume pocket containing the fluid is also difficult to convey.

SUMMARY OF THE INVENTION

To overcome the problems described above, preferred embodiments of the present invention provide a simple and compact structure for a fluid conveyance device which efficiently conveys a fluid.

A preferred embodiment of the present invention provides a fluid conveyance device including a substrate, and a disk-shaped piezoelectric element arranged on the substrate so as to be bendable. A plurality of circular or substantially circular concentric segment electrodes are provided on the piezoelectric element. A voltage application unit is arranged to apply voltage to the segment electrodes with the voltage successively being shifted in phase. The voltages are applied to the segment electrodes with the phase thereof shifted to cause a wavy ring deformation on the piezoelectric element and move a ring pocket caused between the piezoelectric element and the substrate in a radial direction so that a fluid is conveyed between an outer substantially circular portion and a central portion of the substrate.

In accordance with a preferred embodiment of the present invention, the disk-shaped piezoelectric element includes the plurality of circular or substantially circular concentric segment electrodes arranged on the substrate. The substrate and the piezoelectric element are preferably in contact with substantially no gap therebetween when no voltage is applied to the piezoelectric element. When voltages having the same or substantially the same amplitude and shifted in phase are applied to the segment electrodes, a wavy ring deformation occurs on the piezoelectric element. The wavy ring deformation produces a ring pocket between the piezoelectric element and the substrate. The ring pocket moves in a radial direction from the outer substantially circular portion to the inner substantially circular portion or from the inner substantially circular portion to the outer substantially circular portion, thereby conveying the fluid between the outer substantially circular portion and the central portion. Since the ring pocket holding the fluid is sealed by the piezoelectric element itself, leakage of the fluid is minimized. The fluid within the pocket is steadily conveyed, and a high ejection pressure is generated. Since the piezoelectric element has a disk shape including the concentric segment electrodes, a simple and compact structure is achieved.

The fluid conveyed by the fluid conveyance device according to a preferred embodiment of the present invention may preferably be a liquid or a gas (such as air). In particular, if the piezoelectric element is driven at a high frequency, the fluid is preferably a gas. When air is used as the fluid, the fluid conveyance device may preferably be used as a cooling blower for semiconductor devices or a blower for evaporating water generated at an air electrode of a fuel cell. The amplitudes of the voltages applied to the segment electrodes need not necessarily be equal or substantially equal at all of the segment electrodes. However, if the amplitudes of the voltages are set to be equal or substantially equal to each other, the amount of displacement of each of the segment electrodes is set to be substantially equal. If the gaps between the segment electrodes are radially arranged with an equal or substantially equal pitch, the volume of the pocket is changed at a substantially constant rate, and the flow of the fluid is smooth.

Preferably, a first flow passage port is provided on the central portion of one of the substrate and the piezoelectric element, and a second flow passage port is provided on the outer substantially circular portion of one of the substrate and the piezoelectric element or between the outer substantially circular portions of both of the substrate and the piezoelectric element. The reversal of the phases of the voltages applied to the piezoelectric element switches between an operation of suctioning the fluid from the outer substantially circular portion and ejecting the fluid from the central portion and an operation of suctioning the fluid from the central portion and ejecting the fluid from the outer substantially circular portion. More specifically, a switching operation is preferably performed to switch between an operation with the first flow passage port defining an outlet port and the second flow passage port defining an inlet port and an operation with the first flow passage port defining an inlet port and the second flow passage port defining an outlet port. In particular, in the operation with the fluid suctioned through the outer substantially circular portion and then ejected through the central portion, the pocket decreases in volume as the pocket moves from the outer substantially circular portion to the central portion. Thus, an ejection pressure is advantageously increased.

Preferably, the outer substantially circular portion of the piezoelectric element is fixed to the substrate, and the first flow passage port and the second flow passage port are closed by the piezoelectric element and the substrate. Since the first flow passage port and the second flow passage port are closed with no voltage applied, the flow of the fluid is stopped without using a valve.

The full surface of the piezoelectric element may preferably be in contact with the full surface of the substrate when no voltage is applied to the piezoelectric element. In such a case, no pocket is present between the piezoelectric element and the substrate during a no drive period, and the fluid is strongly suctioned and then strongly ejected even if the piezoelectric element is slightly displaced.

In a structure supporting the piezoelectric element on the substrate, the outer substantially circular portion of the piezoelectric element may preferably be fixed to the substrate or may preferably be elastically supported by the substrate. In the former case, the outer substantially circular portion of the piezoelectric element is preferably fixed to the substrate, and the piezoelectric element is prevented from lifting off of the substrate. The efficiency of the pump is increased. In the latter case, the outer substantially circular portion of the piezoelectric element is bent, which causes a second flow passage port between the piezoelectric element and the substrate. The piezoelectric element is not strongly bound and is thus free to be displaced. Any optional support structure may be applied to the piezoelectric element.

The piezoelectric element is preferably a multilayer type having a bimorph structure. For example, the piezoelectric element may be a multilayer type in which at least three circular or substantially circular concentric segment electrodes and a full-surface nonsegmented electrode are alternately laminated with a piezoelectric layer interposed therebetween. The piezoelectric element may preferably be a multilayer type in which a plurality of first substantially circular concentric segment electrodes and a plurality of second segment electrodes are alternately laminated with a piezoelectric layer interposed therebetween, and wherein the second segment electrodes are concentric with the first segment electrodes and gaps between the second segment electrodes are alternately arranged with a gap between the first segment electrodes in a radial direction. In the former case, one electrode is a full-surface electrode, and each of the electrode patterns are the same type. The latter case provides the advantage that the number of segment electrodes on a surface is less than that of the former case, and that the voltage applied to each segment electrode can be reduced.

The segment electrodes arranged on the disk-shaped piezoelectric element are not necessarily arranged to be substantially circular and concentric. The plurality of segment electrodes may be successively deviated to one side. More specifically, if the diameter of the piezoelectric element is reduced, the volume of the pocket formed in a circular shape is reduced in proportion to the diameter of the piezoelectric element approximately to the fourth power. An ejection amount of the fluid thus substantially decreases. In contrast, if the plurality of segment electrodes are successively deviated to one side, each segment electrode includes a wide portion and a narrow portion. With this arrangement, the volume of the pocket is maintained in the wide portion of the each segment electrode. Even if the diameter of the piezoelectric element is decreased, the reduction of the volume of the pocket is minimized, and the reduction in the ejection amount is also minimized.

If the height of the ridge line of the bending deformation is not uniform with the deviated segment electrodes, a clearance gap may open at the edge of the pocket, which leads to poor sealing. Thus, a required amount of flow and pressure of the fluid cannot be obtained. The border line of each electrode must be determined so that the electrode patterns have a uniform ridge line height. For this reason, the border line of the electrode, i.e., the gap between the electrodes, is preferably set to be substantially proportional to the square root of a distance to an imaginary straight line disposed on a circle outside the piezoelectric element. In this case, lines connecting the imaginary straight line to the peak of each pocket portion are aligned on a plane. Thus, each pocket is reliably sealed, and the fluid can be reliably conveyed.

The piezoelectric element described above is arranged in a bendable manner on the fixed substrate. The substrate may preferably be a piezoelectric element. More specifically, two disk-shaped piezoelectric elements are preferably arranged to face each other and be symmetrically displaced. In this case, the volume of the pocket is approximately doubled, which increases the ejection amount.

In accordance with a preferred embodiment of the present invention, the disk-shaped piezoelectric element including the plurality of substantially circular concentric segment electrodes is arranged on the substrate. The voltages are applied to the segment electrodes with the phase of the voltages being successively shifted. Thus, the piezoelectric element is bent, which produces the ring pocket between the piezoelectric element and the substrate. By moving the pocket in a radial direction, the fluid is radially conveyed. Since the piezoelectric element has a disk shape, and the segment electrodes are concentric or substantially concentric, the ring pocket holding the fluid is sealed with the piezoelectric element itself, and a high ejection pressure is produced. Since the fluid conveyance device includes the single disk-shaped piezoelectric element and the substrate, the device can be simple, compact, and thin. Furthermore, since the flow passage between the inlet port and the outlet port is closed by the bent piezoelectric element, check valves are not required for the inlet port and the outlet port.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 11A and 11B illustrate another example of the electrode structure that routes the segment electrode illustrated in FIGS. 5A and 5B to the outside.

FIGS. 12A and 12B illustrate electrode patterns of a piezoelectric element in accordance with a second preferred embodiment of the present invention.

FIGS. 15A and 15B illustrate an example of the electrode structure that routes the segment electrode illustrated in FIGS. 12A and 12B to the outside.

FIGS. 16A and 16B illustrate another example of the electrode structure that routes the segment electrode illustrated in FIGS. 12A and 12B to the outside.

DETAILED DESCRIPTION OF PREFERRED EMBODIMENTS

Preferred embodiments of the present invention are described below with reference to examples.

First Preferred Embodiment

Figure 1:
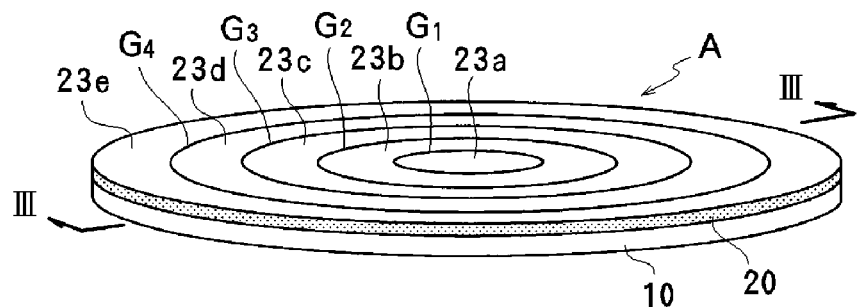
FIG. 1 is a perspective view illustrating a piezoelectric micro pump in accordance with a first preferred embodiment of the present invention.
Figure 2:
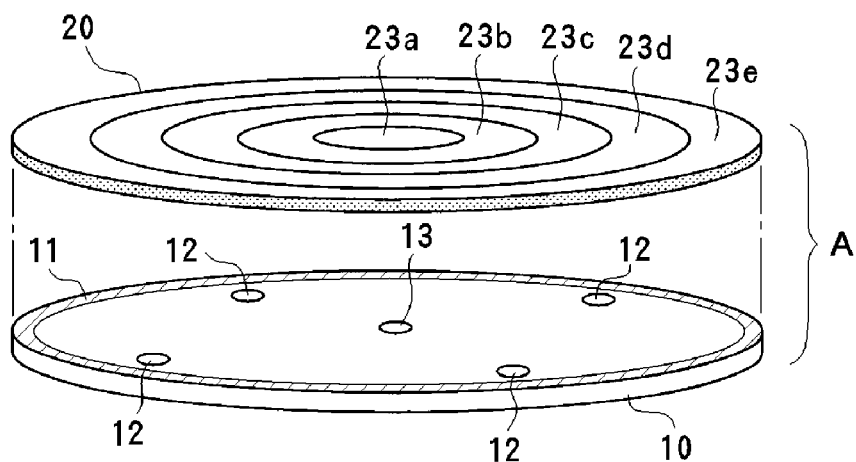
FIG. 2 is an exploded perspective view of the piezoelectric micro pump illustrated in FIG. 1.
Figure 3:
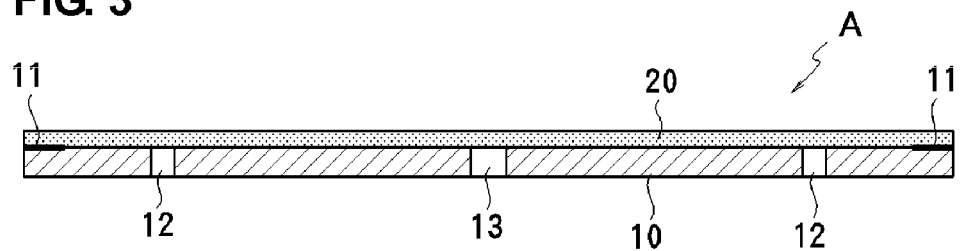
FIG. 3 is a sectional view taken along line III-III in FIG. 1.

FIGS. 1-3 illustrate a first preferred embodiment of the present invention. Here, the fluid conveyance device is preferably used as an air supplying micro pump. FIG. 1 is a perspective view of the micro pump A of the first preferred embodiment, FIG. 2 is an exploded perspective view of the micro pump A, and FIG. 3 is a sectional view taken along line III-III in FIG. 1.

The micro pump A of the first preferred embodiment includes a substrate 10 defining a fixed plate, and a disk-shaped piezoelectric element 20 arranged in a bendable manner on the substrate 10. An entire or substantially entire outer substantially circular portion of the piezoelectric element 20 is preferably bonded to the piezoelectric element 20 preferably by an adhesive agent 11, for example. In accordance with the first preferred embodiment, the substrate 10 and the piezoelectric element 20 are preferably disks having the same or substantially the same diameter, for example. However, the substrate 10 may have any optional shape and may be larger than the piezoelectric element 20, for example. The substrate 10 is preferably a rigid metal plate or a resin plate, for example, and includes on the top portion thereof a planar material member that is in contact with the piezoelectric element 20. A plurality of inlet ports 12 are preferably provided in a portion of the substrate 10 spaced inwardly from the outer substantially circular portion at which the adhesive agent 11 is applied. An outlet port 13 is preferably provided in a portion of the substrate 10 facing the approximate center of the piezoelectric element 20. Alternatively, the inlet ports 12 and the outlet port 13 may be provided on the piezoelectric element 20 instead of the substrate 10 or the inlet ports 12 may be defined by grooves on the top surface of the substrate 10 that communicate with the outer substantially circular portion of the micro pump A. As illustrated in FIG. 3, preferably, the entire or substantially surface of the substrate 10 is in contact with the entire or substantially the entire surface of the piezoelectric element 20 when no voltage is applied to the piezoelectric element 20, and no pocket or cavity is provided therebetween and the inlet ports 12 and the outlet port 13 are closed.

Figure 4:
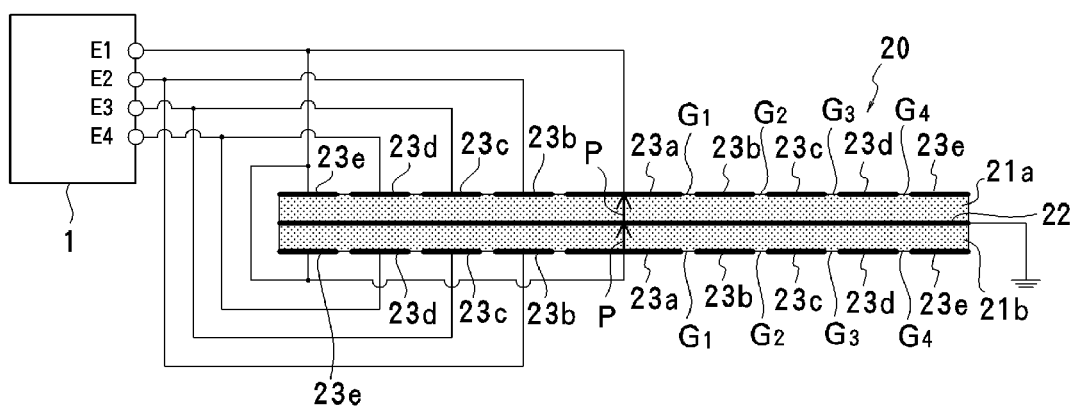
FIG. 4 illustrates a cross section and a wiring of a piezoelectric element for use in the piezoelectric micro pump illustrated in FIG. 1.
Figure 5A:
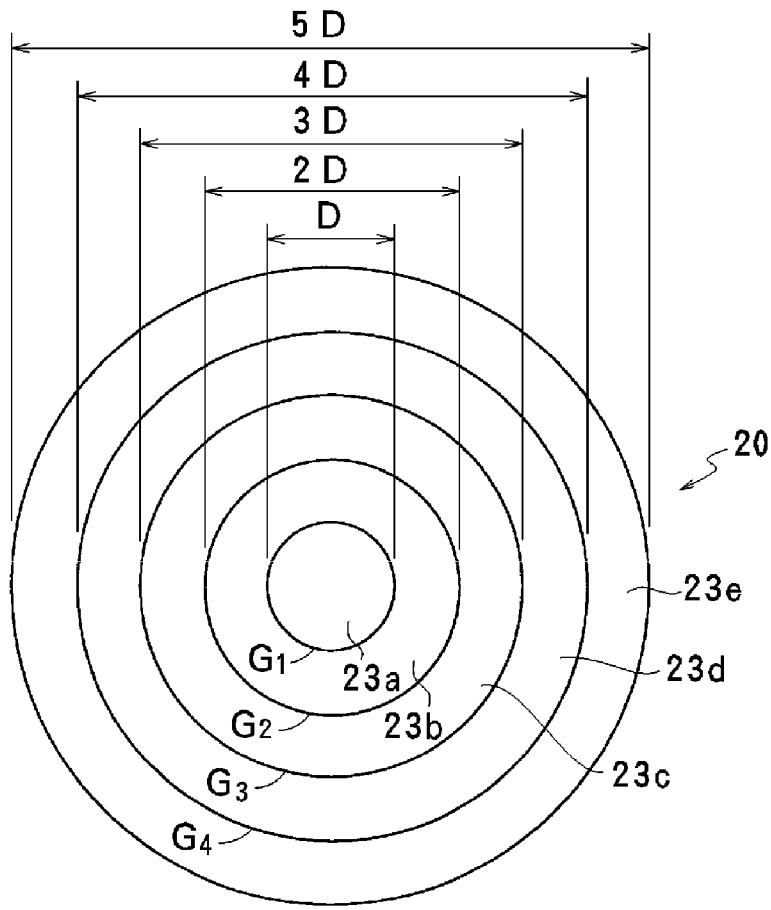
FIGS. 5A and 5B illustrate electrode patterns of the piezoelectric element illustrated in FIG. 4.
Figure 5B:
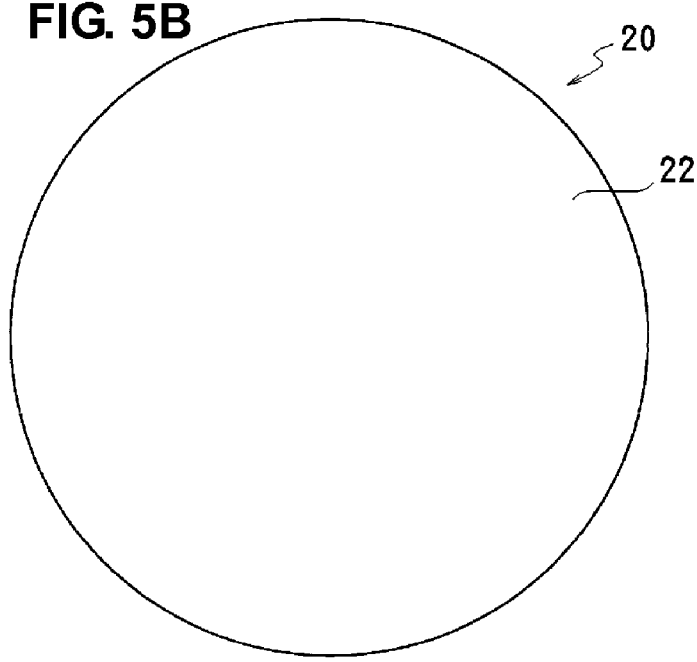

FIGS. 4, 5A, and 5B illustrate the detailed structure and the wiring structure of the piezoelectric element 20. With reference to FIG. 4, the piezoelectric element 20 includes two piezoelectric layers 21a and 21b laminated with a full-surface electrode 22 interposed therebetween. The two piezoelectric layers 21a and 21b are preferably polarized in the same direction as denoted by an arrow P. Preferably, five segment electrodes 23a-23e, for example, are split by narrow gaps G1-G4 and concentrically arranged on the top and bottom main surfaces of the piezoelectric element 20. The segment electrodes 23a-23e preferably include the first substantially circular segment electrode 23a arranged in the approximate center of the piezoelectric element 20, and second through fifth ring segment electrodes 23b-23e arranged to extend outward from the first substantially circular segment electrode 23a, for example. The first central segment electrode 23a is connected to the fifth segment electrode 23e disposed in the outermost substantially circular portion. The segment electrodes 23a-23e on the bottom surface are similarly arranged. The segment electrodes facing each other on the top and bottom surfaces are respectively connected each other, and are then connected to a voltage application device 1. Referring to FIG. 4, the voltage application device 1 preferably applies a voltage E1 to the first and fifth segment electrodes 23a and 23e, a voltage E2 to the second segment electrodes 23b, a voltage E3 to the third segment electrodes 23c, and a voltage E4 to the fourth segment electrodes 23d, for example. The full-surface electrode 22 is connected to the ground, i.e., to zero V.

In the first preferred embodiment, the gaps G1-G4 between the segment electrodes are preferably arranged in circles having the same or substantially the same pitch, for example. More specifically, as illustrated in FIG. 5A, where D represents a diameter D of the gap G1 between the first segment electrode 23a and the second segment electrode 23b, the diameter of the gap G2 between the second segment electrode 23b and the third segment electrode 23c is 2D, the diameter of the gap G3 between the third segment electrode 23c and the fourth segment electrode 23d is 3D, the diameter of the gap G4 between the fourth segment electrode 23d and the fifth segment electrode 23e is 4D, and the external diameter of the fifth segment electrode 23e, which is the external diameter of the piezoelectric element 20, is 5D.

Figure 6:
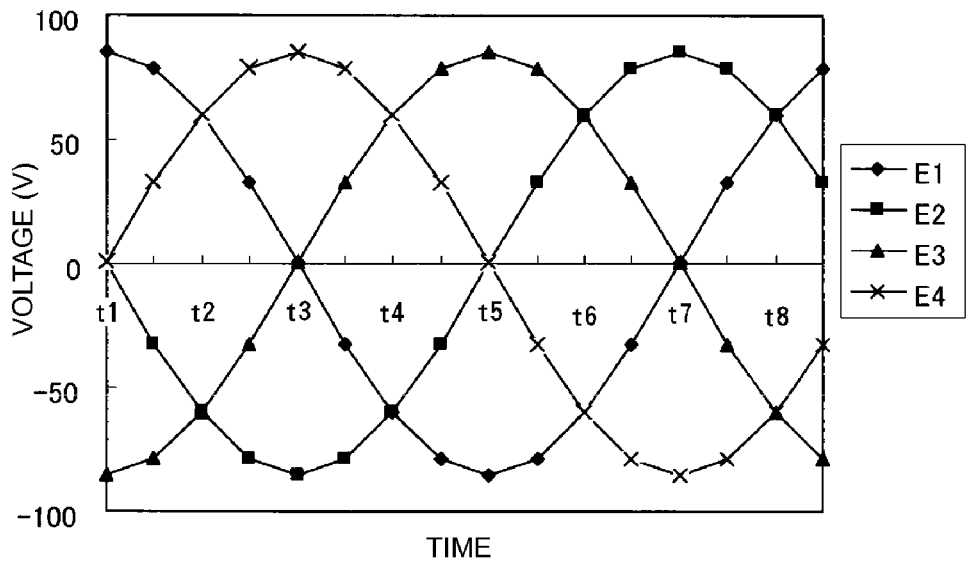
FIG. 6 illustrates phases of voltages applied to the piezoelectric element illustrated in FIG. 4.
Figure 7:
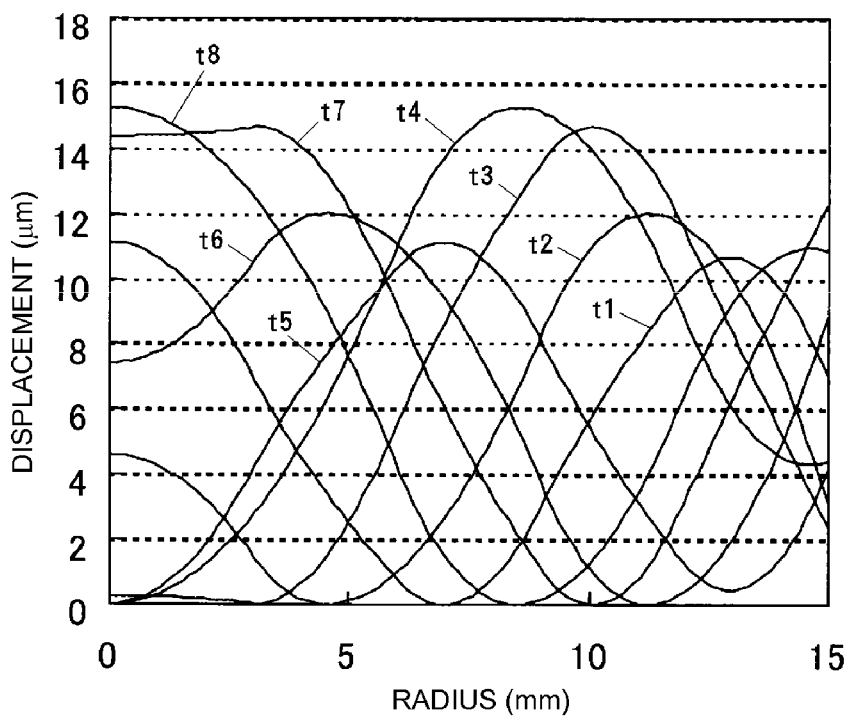
FIG. 7 is an analysis diagram illustrating displacements of the piezoelectric elements at each phase when the voltages illustrated in FIG. 6 are applied.

FIG. 6 illustrates amplitudes and phases of the voltages E1-E4 that the voltage application device 1 applies respectively to the segment electrodes. With reference to FIG. 6, the sinusoidal wave voltages E1-E4 that are different in phase by about 90 degrees and that have the same or substantially the same amplitude are preferably applied. By applying the voltages that are different in phase by about 90 degrees, the displacements illustrated in FIG. 7 are generated on the piezoelectric element 20. The voltages that are different in phase by 90 degrees are preferably applied to the four segment electrodes, for example, in the first preferred embodiment. The phase may be changed depending on the number of segment electrodes. For example, voltages that are different in phase by about 120 degrees may be applied to three segment electrodes, and voltages that are different in phase by about 60 degrees may be applied to six segment electrodes, for example.

FIG. 7 illustrates simulation results of the displacement of each portion of the piezoelectric element 20 with the outer substantially circular portion not being fixed. The piezoelectric element 20 used in the simulation has a diameter of about 30 mm and a thickness of about 0.3 mm, for example. The abscissa of FIG. 7 represents the position in a radial direction and the ordinate represents a displacement of bending deformation in a Z direction (height direction). The smallest displacements are substantially aligned with zero. Phases of sinusoidal waves shifted in steps of about 45° are represented by t1-t8, and eight curves represent the displacements when the voltages are applied to the respective electrodes with the phases thereof shifted by about 45°. The position at zero displacement is presumed to be at a facing surface, e.g., the substrate 10. The piezoelectric element is arranged to contact with the floor surface at a diameter of about 12.5 mm slightly beyond phase t5, and a central contact point and a contact position are reversed. In this manner, a pocket holding the fluid appears at the approximate center between the floor surface and the piezoelectric element. The central pocket decreases in volume as time passes in the order of t5-t6-t7-t8-t1-t2, and finally disappears.

Figure 8:
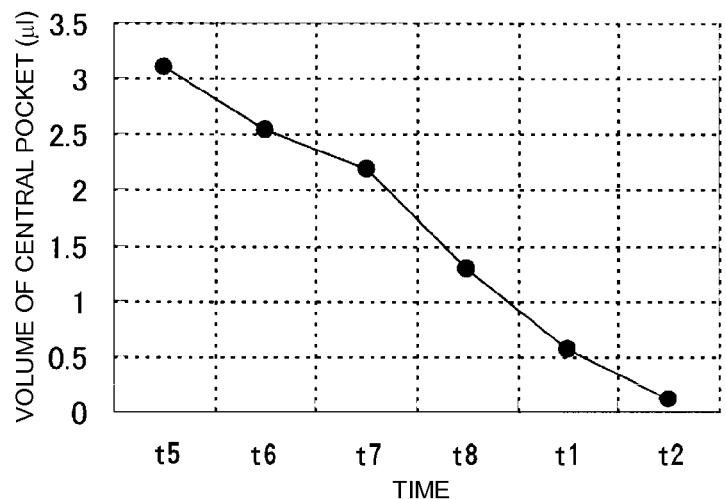
FIG. 8 illustrates a change in the volume of a central pocket with the voltages illustrated in FIG. 6 applied.

FIG. 8 illustrates a change in the volume of the central pocket. It is understood from FIG. 8 that the volume of the central pocket decreases at a substantially constant rate. If a hole 13 is opened at the approximate center of the floor surface (the substrate 10), the fluid can be ejected through the hole in the process of t5-t6-t7-t8-t1-t2-t3. In a subsequent process of t4-t5, the suction of a new fluid input from the outer substantially circular portion is completed. This process is repeated hereinafter. By driving the piezoelectric element 20 with a sufficient frequency, a large average ejection quantity is obtained, although with some fluctuation. The resonance frequency of the piezoelectric element 20 of the first preferred embodiment is about 4 kHz, and a frequency as high as possible but not above the resonance frequency is preferably used.

Figure 9A:
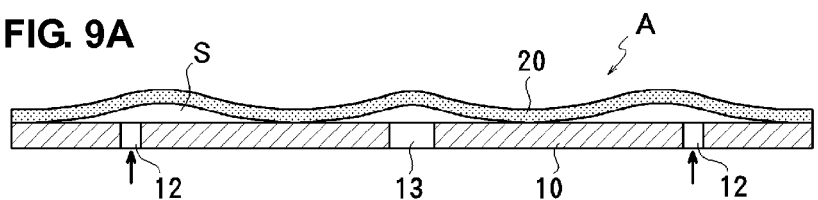
FIGS. 9A to 9D are sectional views illustrating displacements of the piezoelectric element with an outer substantially circular portion of the piezoelectric element fixed to a substrate.
Figure 9B:
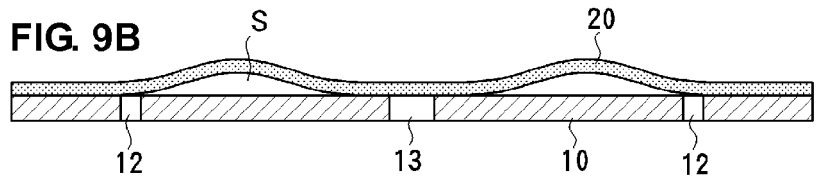
Figure 9C:
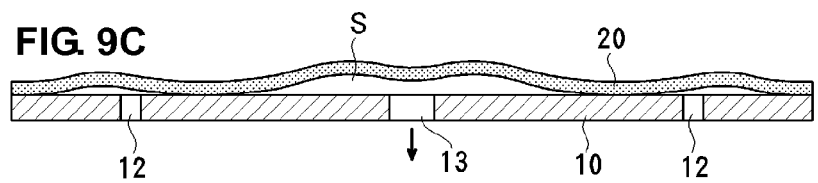
Figure 9D:
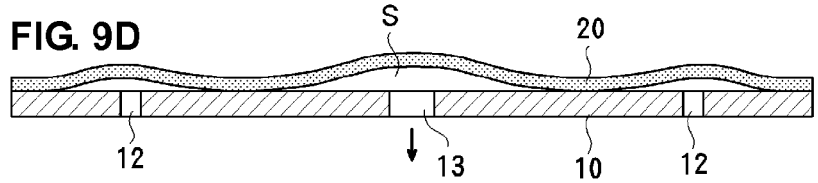

FIGS. 9A to 9D illustrate an actual displacement of the piezoelectric element 20 with the outer substantially circular portion being fixed. With the sinusoidal wave voltages E1-E4 that are different in phase by about 90° and have the same or substantially the same amplitude applied, a wavy bending deformation occurs in a radial direction on the piezoelectric element 20 and a pocket S having a ring shape is produced between the piezoelectric element 20 and the substrate 10 as illustrated in FIGS. 9A and 9D. The pocket S moves from the outer substantially circular portion to the central portion on the piezoelectric element 20. For this reason, the fluid is suctioned through the inlet ports 12 on the outer substantially circular portion and then discharged through the outlet port 13 on the central portion. FIG. 9A illustrates a state of the piezoelectric element 20 in which the ring pocket swell S is generated on the outer substantially circular portion. The fluid is suctioned through the inlet ports 12 and then enters the pocket S. FIG. 9B illustrates a state of the piezoelectric element 20 in which the ring pocket S generated on the outer substantially circular portion moves toward an inner circle with the inlet ports 12 and the outlet port 13 almost closed. In this state, the outer circle and the inner circle of the pocket S holding the fluid are sealed in response to the bending of the piezoelectric element 20, and an amount of leaks of the fluid is very small. FIG. 9C illustrates a state of the piezoelectric element 20 in which the pocket S further moves towards an inner circle until the pocket swell S is merged at the approximate center, and the ejection of the fluid through the outlet port 13 begins. FIG. 9D illustrates a state of the piezoelectric element 20 in which the bending of the piezoelectric element 20 moves further towards an inner circle until the displacement at the approximate center thereof is maximized. The piezoelectric element 20 returns to the state of FIG. 9A and the ejection of the fluid through the outlet port 13 continues until the state of FIG. 9A is resumed.

The micro pump A has the above-described structure that causes the fluid to be suctioned through the inlet ports 12 provided at the outer substantially circular portion and ejects the fluid through the outlet port 13 formed at the center portion. In this case, the ring pocket S shifts from the outer substantially circular portion to the central portion with the volume thereof gradually decreased, and then, causes the fluid to eject through the outlet port 13 at the approximate center in a burst. Therefore, the ejection pressure of the fluid that is ejected through the outlet port 13 is increased. During non-driving periods, the surface of the piezoelectric element 20 remains in contact with the surface of the substrate 10, and produces no pocket. If the piezoelectric element 20 is slightly displaced, the fluid can be suctioned, and then can be ejected at a high pressure.

Figure 10:
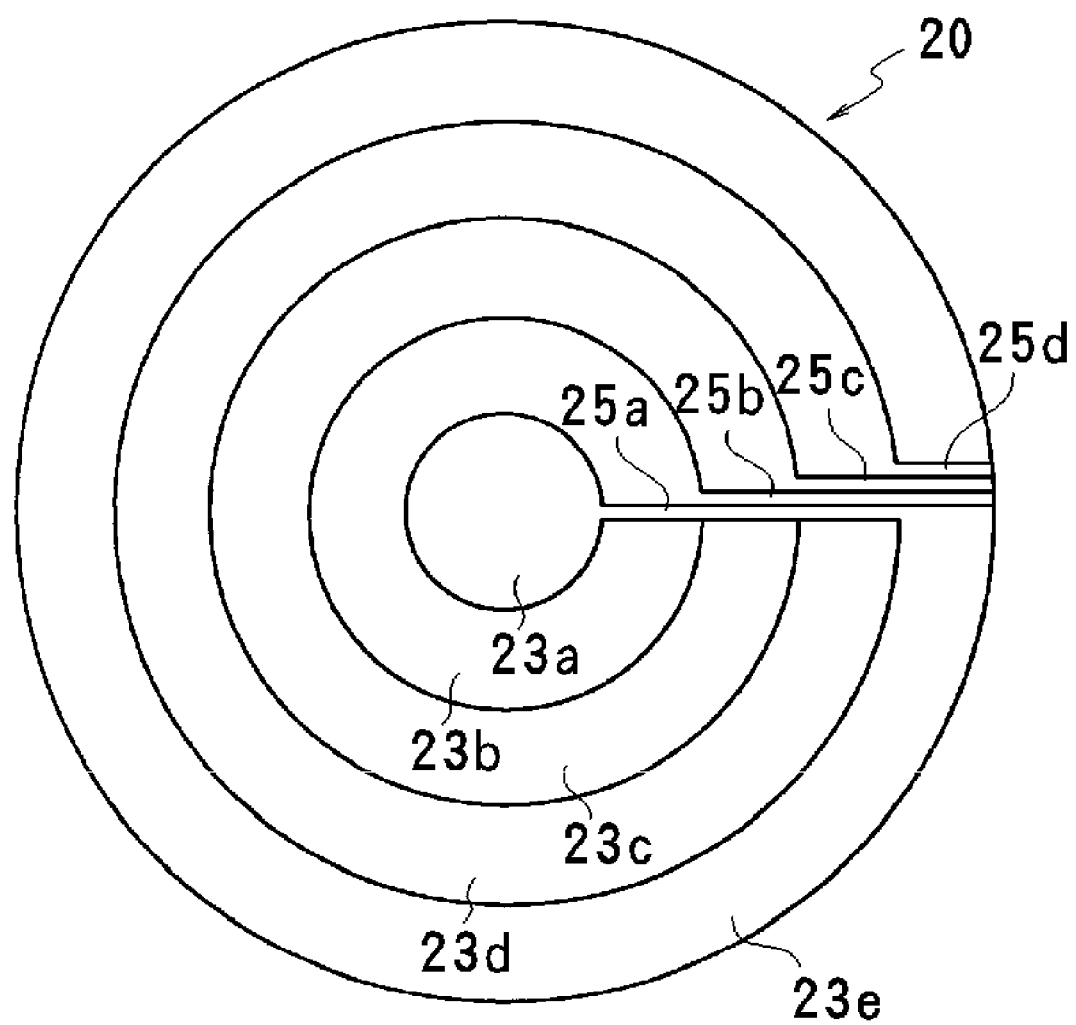
FIG. 10 illustrates an example of the electrode structure that routes a segment electrode illustrated in FIG. 5 to the outside.

FIG. 10 illustrates an example of an electrode structure according to a preferred embodiment of the present invention that routes the segment electrodes 23a-23e provided on the top and bottom surfaces to the outside. Referring to FIG. 10, an extension electrode 25a extending radially from the first segment electrode 23a at the approximate center to the outer circle edge is provided. Extension electrodes 25b-25d extending radially from the second-fourth segment electrodes 23b-23d and in parallel or substantially in parallel with the extension electrode 25a to the outer circle edge are provided. The extension electrode 25a extending from the first segment electrode 23a is preferably connected to the fifth segment electrode 23e on the main surface. Alternatively, the extension electrode 25a may preferably be separated from the fifth segment electrode 23e. The segment electrodes 23a-23e on both of the top surface and the bottom surface extend to the outer circle edge and can preferably be connected together by an edge electrode (not shown).

Figure 11A:
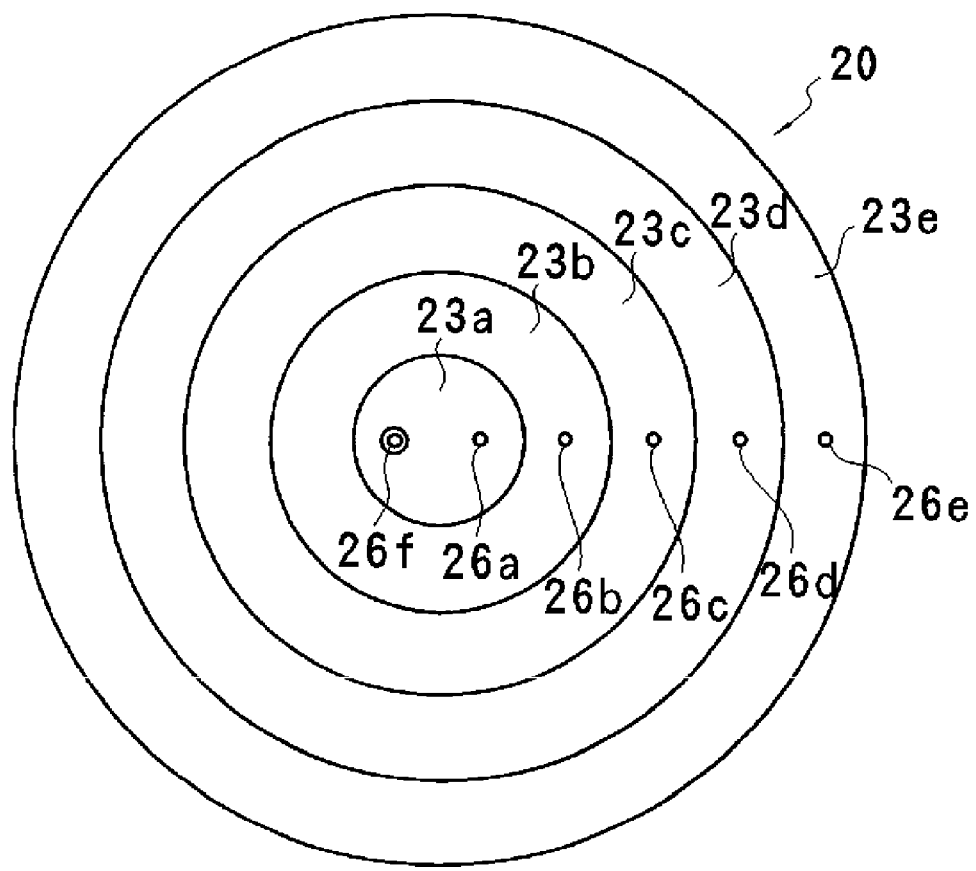

If the piezoelectric element 20 has a multi-layered structure, through-holes 26a-26f may preferably be used to connect the segment electrodes 23a-23e on the top and bottom surfaces as illustrated in FIGS. 11A and 11B, for example. The through-holes 26a-26e are through-holes respectively connecting the segment electrodes 23a-23e on the top surface to their counterpart segment electrodes on the bottom surface, and the through-hole 26f is a through-hole connecting the full-surface electrodes. In this case, electrode extensions are required only at the through-hole portion, and a deformation can be produced in a shape that is closer to an axial symmetrical shape.

If the piezoelectric micro pump A is arranged such that the outlet port 13 faces a heat generating element (such as a semiconductor bare chip), air pushed out through the outlet port can effectively cool the heat generating element. If the piezoelectric micro pump A is arranged to face an air electrode of a direct-methanol fuel cell, water generated at the air electrode is evaporated and thus removed. The output of the fuel cell is increased thereby. In the case of a stacked fuel cell, a flow passage may be arranged so that air pushed out through the outlet port 13 flows between the cells, and water generated at the air electrode is evaporated and removed. The output of the fuel cell is increased.

Second Preferred Embodiment

Figure 12B:
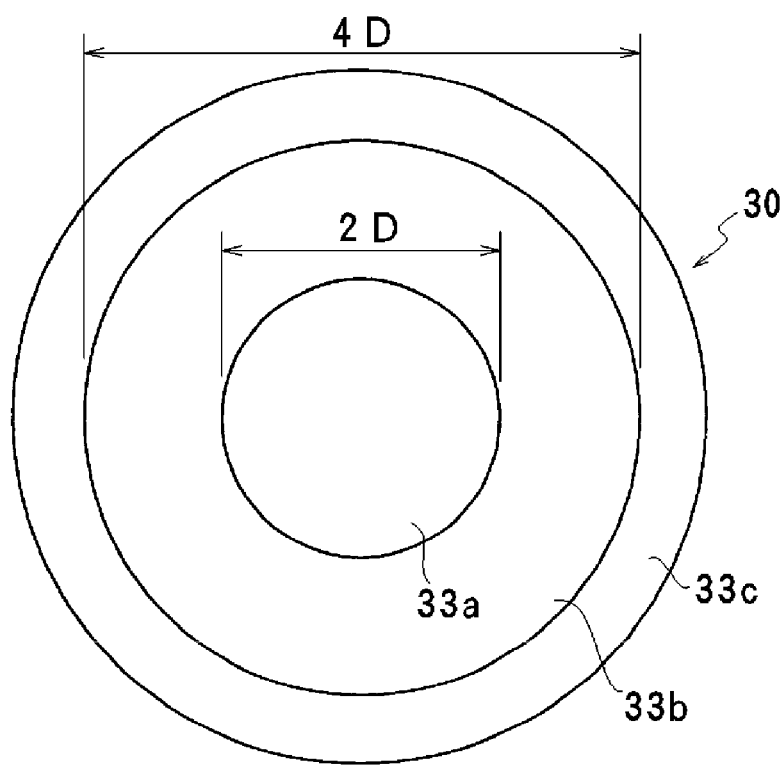

FIGS. 12A-14 illustrates a second preferred embodiment of a fluid conveyance device of the present invention. Unlike the first preferred embodiment, the second preferred embodiment includes two different patterns as the segment electrodes of a piezoelectric element 30. With the diameter of the piezoelectric element 30 being 5D, a first electrode pattern includes three concentric substantially circular segment electrodes 32a-32c divided along a diameter D and a diameter 3D as illustrated in FIG. 12A, and a second electrode pattern includes three concentric substantially circular segment electrodes 33a-33c divided along a diameter 2D and a diameter 4D as illustrated in FIG. 12B.

Figure 13:
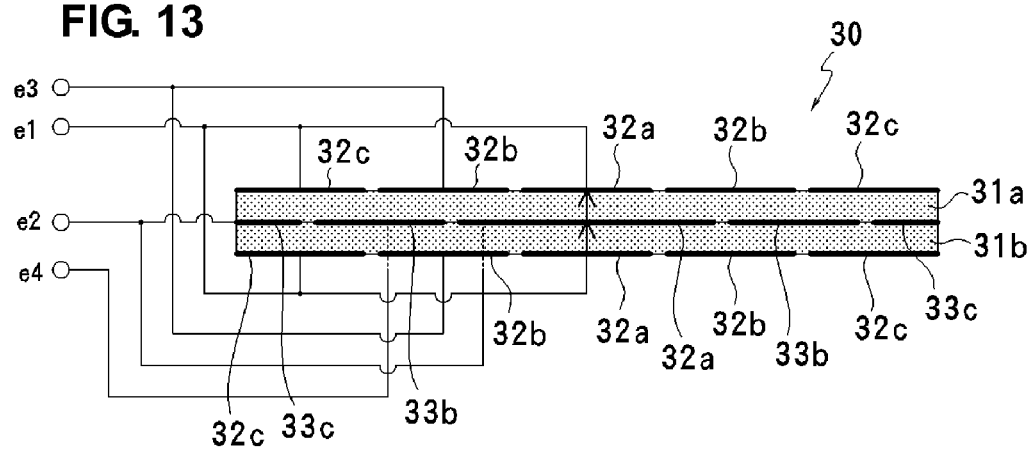
FIG. 13 illustrates a cross section and a wiring of the piezoelectric element illustrated in FIGS. 12A and 12B.

As illustrated in FIG. 13, two types of segment electrodes 32a-32c and 33a-33c are preferably laminated with piezoelectric layers 31a and 31b interposed therebetween. The segment electrodes 32a at the approximate center are mutually connected to the outermost segment electrodes 32c, and the segment electrodes on the top surface are respectively connected the segment electrodes on the bottom surface. The interlayer segment electrodes 33a and 33c are connected to each other and an extension therefrom is routed to the outside. The interlayer segment electrode 33b is preferably separately routed to the outside. A voltage application device that is not illustrated applies a voltage e1 to the segment electrodes 32a and 32c, a voltage e2 to the segment electrodes 33a and 33c, a voltage e3 to the segment electrode 32b, and a voltage e4 to the segment electrode 33b. FIG. 13 illustrates an example in which the first electrode pattern 32a-32c defines the main surface electrodes, and the second electrode pattern 33a-33c defines as the interlayer electrodes. Alternatively, the first electrode pattern 32a-32c may define the interlayer electrodes, and the second electrode pattern 33a-33c may define the main surface electrodes.

Figure 14:
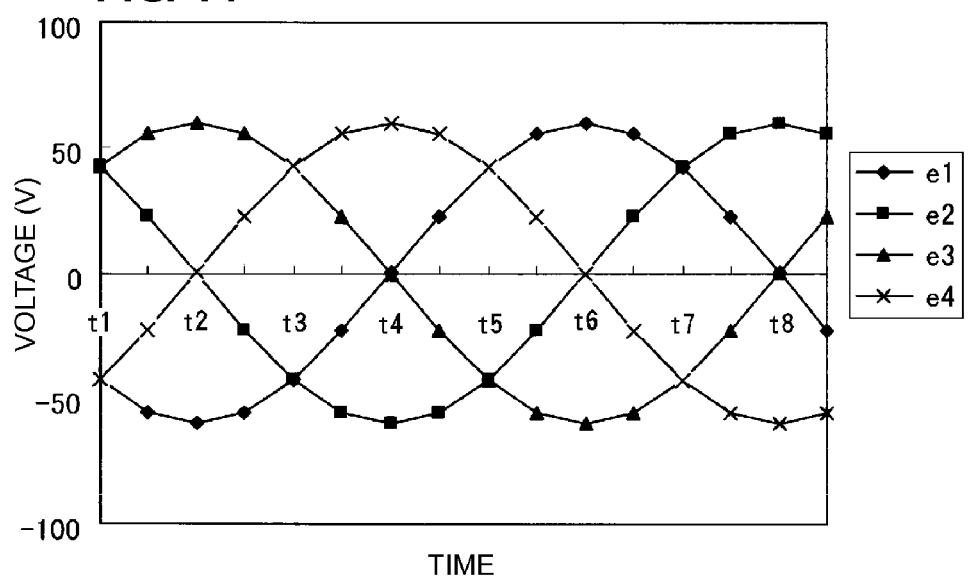
FIG. 14 illustrates phases of voltages applied to the piezoelectric element illustrated in FIGS. 12A and 12B.

FIG. 14 illustrates the amplitude and phases of the voltage e1-e4 applied to the segment electrodes. As illustrated in FIG. 14, the sinusoidal wave voltages e1-e4 that are different from each other in phase by about 90 degrees and that have the same amplitude are applied to the segment electrodes, and a displacement similar to the displacement illustrated in FIG. 7 is produced on the piezoelectric element 30. In the first preferred embodiment, the voltages E1-E4 having phases that are shifted by about 90 degrees one from another are applied between the segment electrodes 23a-23e and the full-surface electrode 22 (0 V). In the second preferred embodiment, the voltages e1-e4 having the phases that are shifted by about 90 degrees from one another are applied between the segment electrodes facing each other with the piezoelectric layer interposed therebetween. Even with voltages e1-e4 having smaller amplitudes than the voltages E1-E4, the same or substantially the same displacement amounts are produced. The number of segment electrodes provided on one surface is less than in the first preferred embodiment. In other words, the number of gaps defining the segment electrodes is reduced, and the piezoelectric element 30 is effectively bent.

FIGS. 15A and 15B illustrate an example of a structure that is provided to extend the segment electrode on the piezoelectric element 30 of the second preferred embodiment. Referring to FIG. 15A, the central segment electrode 32a and the segment electrode 32c on an outer substantially circular portion are connected to each other by an extension electrode 35a extending in a radial direction. Moreover, the intermediate segment electrode 32b is routed to an outer substantially circular edge via an extension electrode 35b. Referring to FIG. 15B, the central segment electrode 33a and the segment electrode 33c on an outer substantially circular portion are connected to each other by an extension electrode 36a extending in a radial direction. The intermediate segment electrode 33b is thus routed to an outer substantially circular edge via an extension electrode 36b extending in a radial direction. The extension electrodes 35a and 35b and the extension electrodes 36a and 36b are preferably arranged in perpendicular or substantially perpendicular directions, for example, so that the extension electrodes do not cross each other. The electrodes that extend to the outer substantially circular edge are preferably connected by an edge electrode (not shown), for example.

FIGS. 16A and 16B illustrate the piezoelectric element 30 in which through-holes are provided instead of the extension electrodes in a radial direction and the edge electrode illustrated in FIGS. 15A and 15B. More specifically, the first electrode patterns 32a-32c are respectively connected to each other and the second electrode patterns 33a-33c are respectively connected to each other by the though-holes 37a-37f. In this case, electrode extensions are required only at the through-hole portion, and the deformation that is produced can preferably have a shape closer to an axial symmetrical shape.

Third Preferred Embodiment

Figure 17:
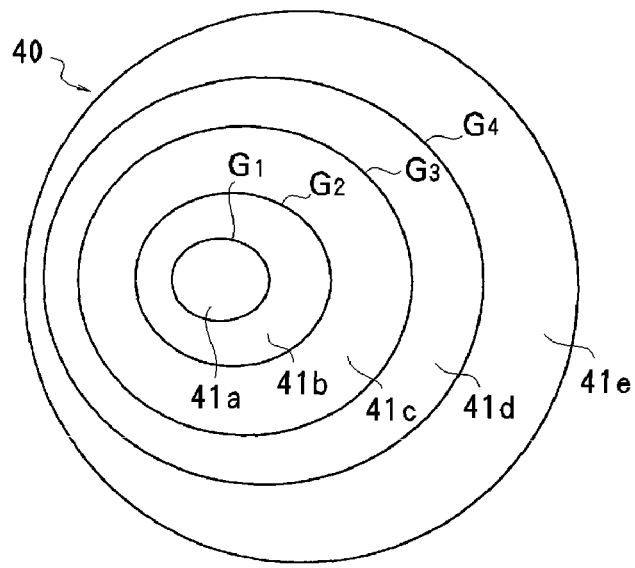
FIG. 17 illustrates an electrode pattern of a piezoelectric element in accordance with a third preferred embodiment of the present invention.
Figure 18:
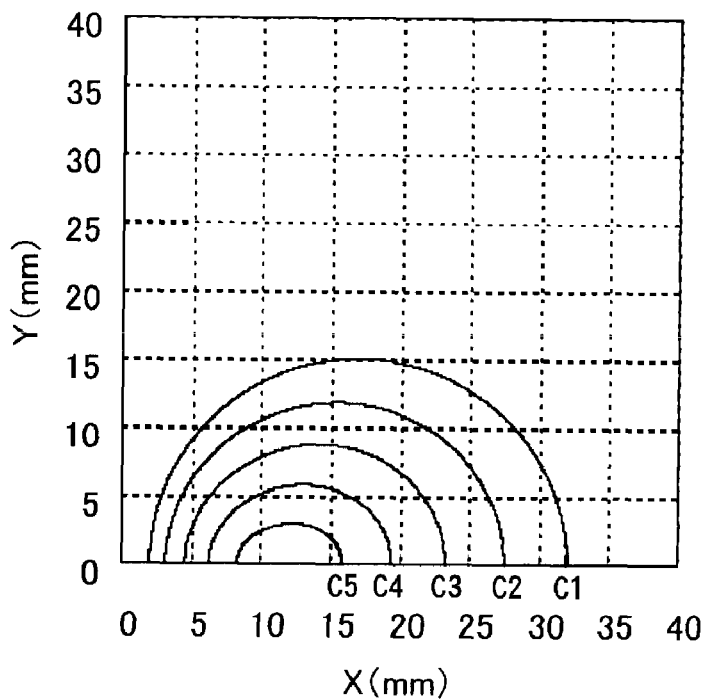
FIG. 18 illustrates a design method of the electrode pattern of the piezoelectric element illustrated in FIG. 17.
Figure 19:
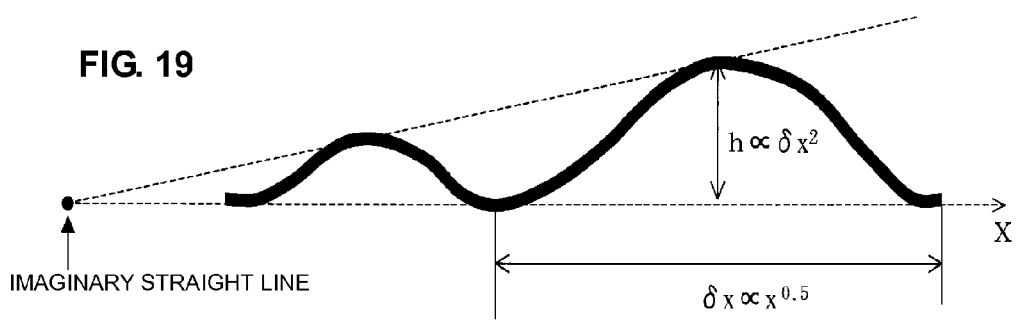
FIG. 19 illustrates a displacement of the piezoelectric element illustrated in FIG. 17.
Figure 20A:
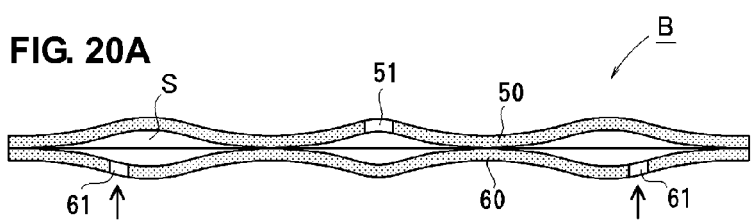
FIGS. 20A to 20D are sectional views of a displacement of a piezoelectric micro pump according to a fourth preferred embodiment of the present invention.
Figure 20B:
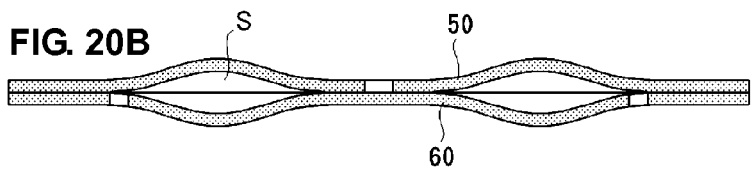
Figure 20C:
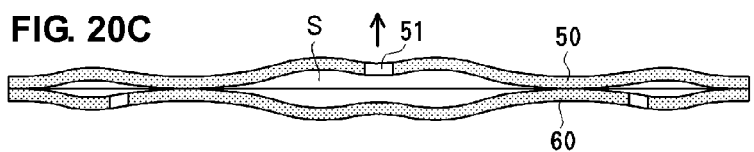
Figure 20D:
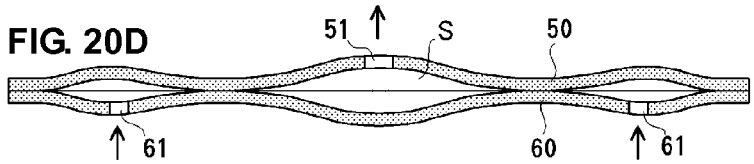

FIGS. 17-19 illustrate a third preferred embodiment of the fluid conveyance device of the present invention. In accordance with the third preferred embodiment, the electrode patterns of a piezoelectric element 40 are not concentric, but are arranged in a deviated arrangement as illustrated in FIG. 17. More specifically, ring segment electrodes 41b-41e are successively arranged around a central segment electrode 41a in an arrangement that is not centered. A pitch of the gaps G4-G4 defining border lines between the segment electrodes is set to substantially proportional to the square root of a distance to an imaginary straight line O, shown in FIG. 19, outside the piezoelectric element 40. In this preferred embodiment, the imaginary straight line O is x=0 (Y axis in FIG. 18). The border line pitch is preferably set to be about $0.8x^{0.5}$, for example, so that the pitch is substantially proportional to the square root of a distance x from the imaginary straight line O. If the diameter of the piezoelectric element 40 is about 30 mm, for example, the center of the piezoelectric element 40 is (x,y)=(17,0).

A displacement height h is approximately proportional to the square of the border line pitch (pitch of the gaps G1-G4) during deformation. Therefore, the volume of the pocket holding the air is increased to a greater extend when the electrodes are arranged in a deviated manner than when the electrodes are concentrically arranged. For this reason, the deviated electrodes are more advantageous to increase the amount of flow of the fluid. However, if the height of the ridge of the deformation is not uniform, a clearance gap may be opened at the edge of the pocket. As a result, the device may suffer from poor sealing and may lack a flow amount and pressure. Thus, the border line needs to be determined so that an electrode pattern that results in a uniform height of the ridge of the pocket is provided.

The displacement height h of the deformation is approximately proportional to the square of the border line pitch. If the border line pitch is set to be proportional to the square root of the distance from the imaginary straight line O outside the piezoelectric element, the height of the ridge is aligned substantially in a single plane. If the border line pitch is selected as illustrated in FIG. 19 so that the border line pitch is proportional to the square root of the distance x from the imaginary straight line O, a pocket pitch δx is substantially proportional to the border line pitch. The pocket pitch δx is also substantially proportional to the square root of the distance x from the imaginary straight line O as below.

$$\delta x \propto x^{0.5}$$

where the pocket height is proportional to the square of the pocket pitch, the pocket height is proportional to the distance from the imaginary straight line O as below.

$$h \propto \delta x^2 \propto x$$

A specific formation method of the segment electrodes 41b-41e is described below. Referring to FIG. 18, a circle C1 defining an outer diameter of the piezoelectric element 40 is first drawn. An approximate circle C2 is next drawn by connecting points on lines drawn perpendicular to each point on the circle C1, the points to be connected being located at $0.8x^{0.5}$ of the extension of each normal line inside the circle C1. In a similar process, approximate circles C3, C4 and C5 are drawn. The shapes of the segment electrodes 41b-41e are thus determined.

Fourth Preferred Embodiment

FIGS. 20A to 20D illustrate a piezoelectric micro pump B in accordance with a fourth preferred embodiment of the present invention. In the first to third preferred embodiments, the piezoelectric element is preferably arranged to face the substrate which is a fixed plate. In the fourth preferred embodiment, two piezoelectric elements 50 and 60 are arranged so as to face each other. In this preferred embodiment, outer substantially circular portions of the piezoelectric elements 50 and 60 are bonded together. The piezoelectric element 50 includes at the approximate center thereof an outlet hole 51 and the piezoelectric element 60 includes inlet holes 61 on the outer substantially circular portion thereof. The piezoelectric micro pump B preferably suctions the fluid from the bottom side thereof and ejects the fluid through the center of the top side thereof. In this case, the volume of the pocket S holding the fluid is about twice as large as the volume that is produced when the fixed plate provided. Thus, the amount of flow of the fluid is advantageously increased. Alternatively, both the inlet hole and the outlet hole may be arranged on one of the piezoelectric element 50 and the piezoelectric element 60.

Fifth Preferred Embodiment

Figure 21:
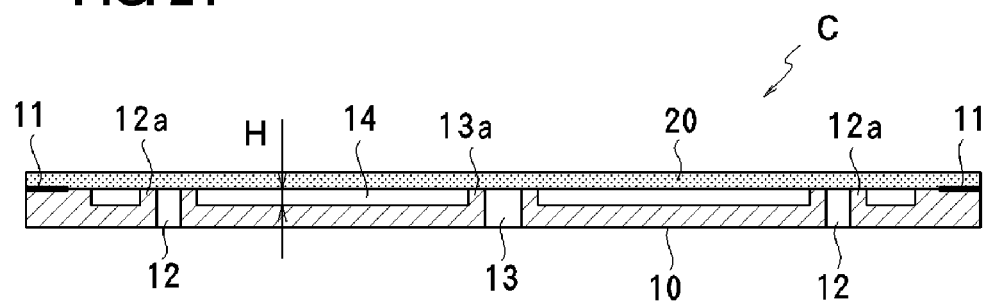
FIG. 21 is a sectional view of a piezoelectric micro pump according to a fifth preferred embodiment of the present invention.

FIG. 21 illustrates a piezoelectric micro pump C according to a fifth preferred embodiment of the present invention. Similar to the first preferred embodiment, the fifth preferred embodiment includes the piezoelectric element 20 with the outer substantially circular portion thereof being bonded to the substrate 10 preferably with the adhesive agent 11, for example. During a no-voltage application period (non-driving period) of the piezoelectric element 20, the surface of the piezoelectric element 20 is not entirely in contact with the substrate 10, and a gap 14 is provided between the substrate 10 and the piezoelectric element 20 in an area other than flow passage ports 12 and 13 of the substrate 10. The height H of the gap 14 is less than the amplitude of the piezoelectric element 20. During the no-voltage application period, the piezoelectric element 20 is in contact with ring valve seats 12a and 13a that surround the flow passage ports 12 and 13, and the surface pressure acting on the ring valve seats 12a and 13a is increased. Sealing performance of the flow passage ports 12 and 13 is thus increased. In addition, in this preferred embodiment, the height of the gap 14 is less than the amplitude of the piezoelectric element 20, and the fluid is suctioned and ejected at high pressure.

Sixth Preferred Embodiment

Figure 22:
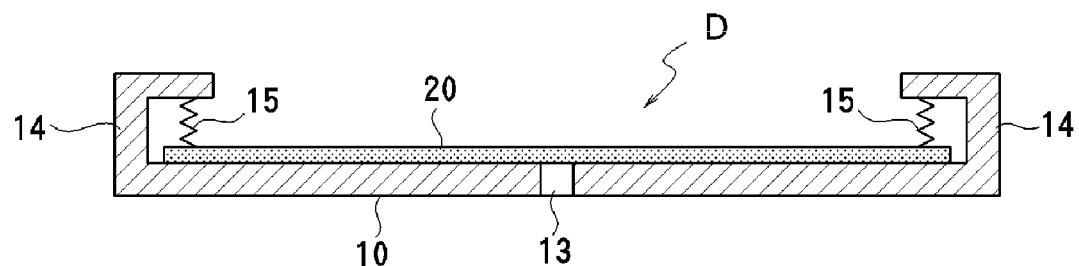
FIG. 22 is a sectional view of a piezoelectric micro pump according to a sixth preferred embodiment of the present invention.

FIG. 22 illustrates a piezoelectric micro pump D according to a sixth preferred embodiment of the present invention. In the sixth preferred embodiment, a holder 14 is provided on the substrate 10. Elastic members 15 elastically bias the outer substantially circular portion of the piezoelectric element 20 against the substrate 10. In this case, the outer substantially circular portion of the piezoelectric element 20 is not rigidly fixed to the substrate 10, and the edge of the outer substantially circular portion of the piezoelectric element 20 is also displaceable. For this reason, the amount of fluid that can be suctioned along the outer substantially circular portion of the piezoelectric element 20 and ejected is increased.

The above-described preferred embodiments preferably have a multilayer structure in which two piezoelectric layers are laminated as a piezoelectric element. Alternatively, three or more piezoelectric layers may be laminated. The use of a large number of thin layers enables a lower application voltage to be used.

A multilayer structure is preferably produced by firing each piezoelectric layer having a single layer structure, forming electrodes on the top and bottom surfaces of each piezoelectric layer, and then bonding the piezoelectric layers together. Another multilayer structure is produced by laminating a plurality of ceramic green sheets, each having electrodes, and then firing the laminate.

According to the above-described preferred embodiments, the fluid conveyance device of the present invention is preferably applied as a micro pump to convey a compressible fluid, such as the air, for example. The fluid conveyance device may preferably be applied to a noncompressible fluid, such as a liquid, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A fluid conveyance device comprising:
a substrate; and
a disk-shaped piezoelectric element arranged in a bendable manner on the substrate; wherein
a plurality of substantially circular segment electrodes are provided on the piezoelectric element and deviated to one side of the piezoelectric element;
a voltage application device arranged to apply voltage to the segment electrodes such that the voltage is successively shifted in phase among the segment electrodes; and the voltages are applied to the segment electrodes with the phases thereof shifted so as to produce a wavy ring deformation on the piezoelectric element and to move a pocket that is produced between the piezoelectric element and the substrate in a radial direction such that a fluid is conveyed between an outer substantially circular portion and a central portion of the substrate.

2. The fluid conveyance device according to claim 1, wherein a gap between the segment electrodes is proportional to a square root of a distance to an imaginary straight line tangent to an outside circle of the piezoelectric element.

3. The fluid conveyance device according to claim 1, wherein the substrate is defined by another piezoelectric element having a same structure as the piezoelectric element; and voltages having substantially the same phase are applied to the segment electrodes facing each other on the piezoelectric element and the another piezoelectric element with the phase of the voltage successively shifted so as to symmetrically produce the ring wavy deformation on the piezoelectric element and the another piezoelectric element and move the pocket that is produced between the piezoelectric element and the another piezoelectric element in the radial direction such that the fluid is conveyed.

* * * * *